United States Patent
Lo et al.

(10) Patent No.: US 8,871,535 B2
(45) Date of Patent: Oct. 28, 2014

(54) METHOD FOR MANUFACTURING LED

(71) Applicant: Advanced Optoelectronic Technology, Inc., Hsinchu Hsien (TW)

(72) Inventors: Hsing-Fen Lo, Hsinchu (TW); Chieh-Ling Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/865,164

(22) Filed: Apr. 17, 2013

(65) Prior Publication Data

US 2013/0280834 A1    Oct. 24, 2013

(30) Foreign Application Priority Data

Apr. 24, 2012 (CN) .......................... 2012 1 0121631

(51) Int. Cl.
*H01L 33/50* (2010.01)
*H01L 33/00* (2010.01)

(52) U.S. Cl.
CPC ....... *H01L 33/502* (2013.01); *H01L 2933/0041* (2013.01); *H01L 33/0095* (2013.01)
USPC ............................................. 438/27; 257/98

(58) Field of Classification Search
CPC ................... H01L 33/0095; H01L 33/502
USPC .......................................................... 438/27
See application file for complete search history.

(56) References Cited

U.S. PATENT DOCUMENTS

| | | | |
|---|---|---|---|
| 2002/0173074 A1* | 11/2002 | Chun-Jen et al. | 438/108 |
| 2009/0290362 A1* | 11/2009 | Wei et al. | 362/373 |
| 2011/0127689 A1* | 6/2011 | Kim et al. | 264/101 |
| 2012/0107975 A1* | 5/2012 | Chan et al. | 438/27 |
| 2013/0032842 A1* | 2/2013 | Park et al. | 257/98 |

* cited by examiner

*Primary Examiner* — Olik Chaudhuri
*Assistant Examiner* — Christine Enad
(74) *Attorney, Agent, or Firm* — Novak Druce Connolly Bove + Quigg LLP

(57) ABSTRACT

A method for manufacturing an LED package includes following steps: providing a base with an LED chip mounted on the base; providing a porous carrier with a plurality of holes, and disposing the base on the porous carrier; providing a film with a phosphor layer attached on the film; providing a mold, and putting the porous carrier, the base, the LED chip, and the film into the mold; extracting air from the mold to an external environment through the holes of the porous carrier, and/or, blowing air toward the film to urge the film to move toward the LED chip, resulting in that the film is conformably attached onto the LED chip and the base; and solidifying the phosphor layer on the LED chip by means of heating whereby the phosphor is conformably and securely attached on the LED chip.

14 Claims, 7 Drawing Sheets

METHOD FOR MANUFACTURING LED

BACKGROUND

1. Technical Field

The disclosure relates a method for manufacturing an LED (light emitting diode), and particularly to a method for manufacturing an LED which has a phosphor film containing fluorescent powders uniformly distributed therein.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED includes a base, first and second electrodes secured to the base, an LED chip arranged on the base and electrically connected to the first and second electrodes, and an encapsulation structure encapsulating the LED chip. To improve light emission characteristic of the LED, a large number of fluorescent powders are mixed into glue, before the glue is dispensed on the LED chip to form the encapsulation structure. However, deposition of the fluorescent powders in the glue will occur easily during the time when the glue is solidified, which results in an uneven distribution of the fluorescent powders in the solidified glue, and adversely influences light emission quality, for example, intensity uniformity and color uniformity, of the LED.

Therefore, what is needed is a method for manufacturing an LED which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION OF EMBODIMENTS

A method for manufacturing an LED 100 (FIG. 7) in accordance with an embodiment is provided, which includes the following steps.

Figure 1:
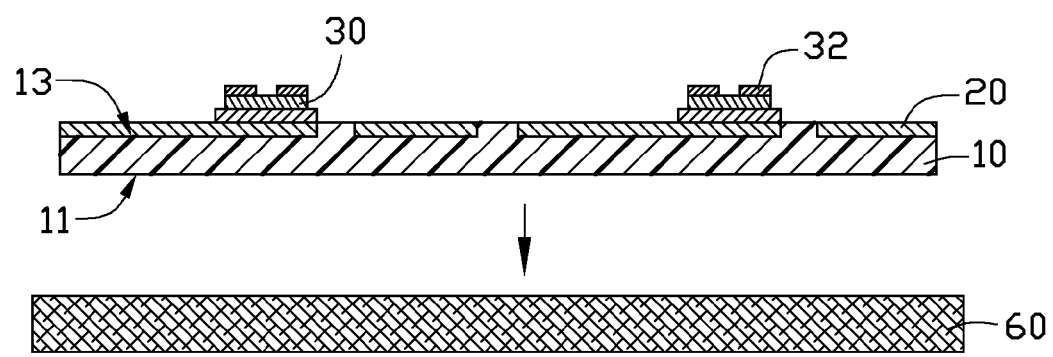
FIGS. 1-7 are schematic views showing steps of a method for manufacturing an LED in accordance with an embodiment of the present disclosure.

Referring to FIG. 1, the first step is to provide a base 10. The base 10 employs sapphire or silicon carbide in this embodiment. The base 10 includes a top face 13 and a bottom face 11. An electrical connection portion 20 is arranged on the top face 13 of the base 10.

The second step is to provide a plurality of LED chips 30 and arrange the LED chips 30 on the base 10. Specifically, the LED chips 30 are fixed on the electrical connection portion 20. Each LED chip 30 includes two electrodes 32. The electrodes 32 are electrically connected to the electrical connection portion 20 via conductive wires 36, respectively (shown in FIG. 7).

The third step is to provide a porous carrier 60 with a plurality of holes (not shown) therein, and place the base 10 on the porous carrier 60. The holes of the porous carrier 60 extends to both top and bottom faces of the porous carrier 60 and are communicated with each other. The porous carrier 60 is larger than the base 10 in area.

Figure 2:
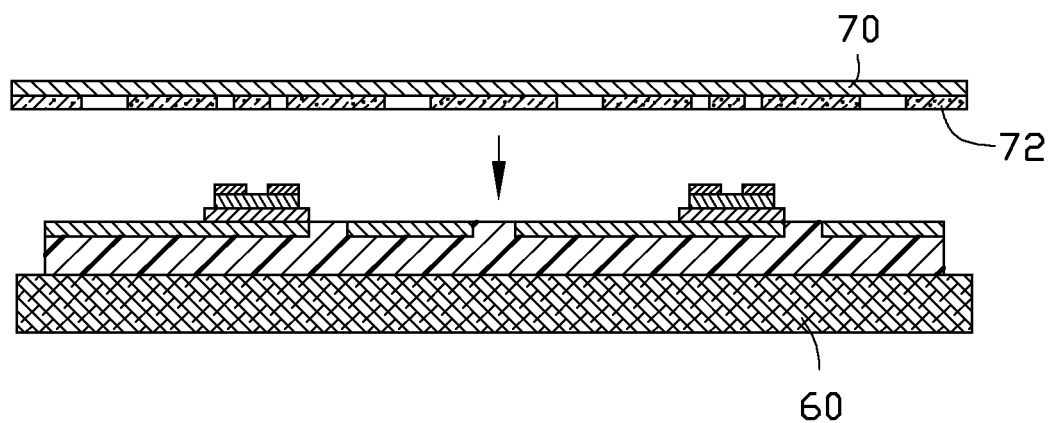

Referring to FIG. 2, the fourth step is to provide a film 70 with a phosphor layer 72 attached thereon, and place the film 70 on the LED chips 30. The film 70 has a certain strength and elasticity. A top face of the phosphor layer 72 is attached on a bottom face of the film 70. A bottom face of the phosphor layer 72 contacts the LED chips 30. The phosphor layer 72 defines a plurality of through holes (not labeled), corresponding to the electrodes 32 of the LED chips 30 and parts of the electrical connection portion 20. The phosphor layer 72 contains fluorescent powders uniformly distributed therein. The fluorescent powders preferably are garnet powders. In this step, the phosphor layer 72 contacting the LED chips 30 is in semi-solidified state, which means that the phosphor layer 72 has a reduced flowability and however is still deformable. Since the phosphor layer 72 is in semi-solidified state, deposition of the fluorescent powders in the phosphor layer 72 will not occur easily, and therefore the fluorescent powders are uniformly distributed in the phosphor layer 72.

Figure 3:
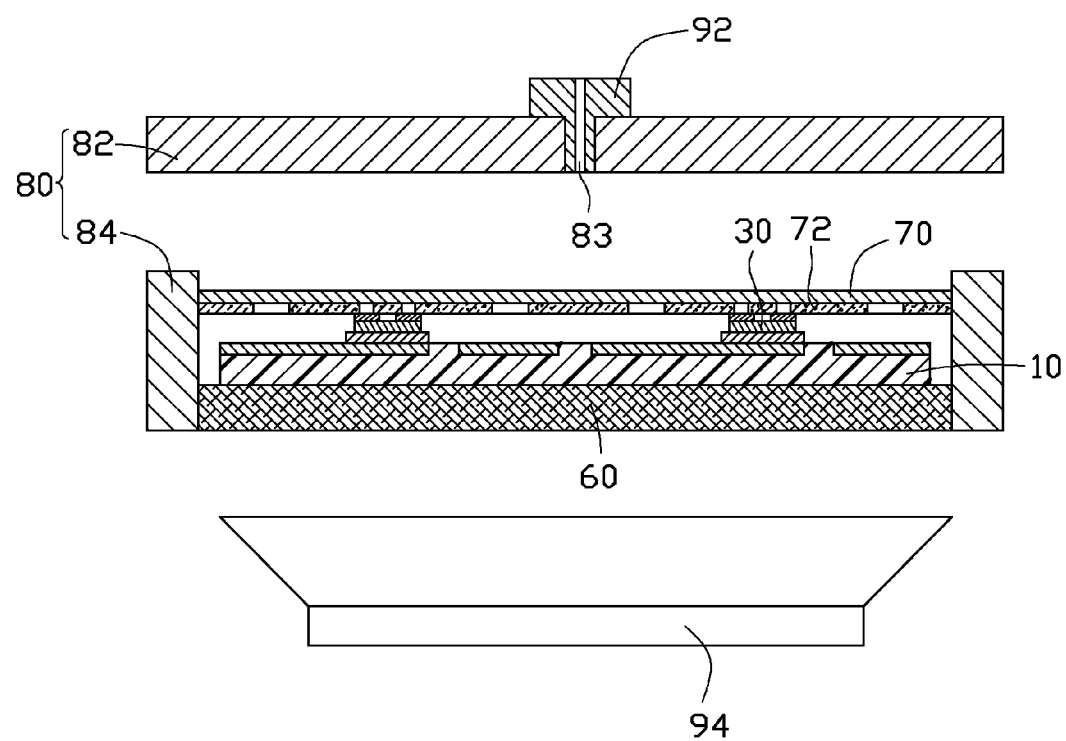

Referring to FIG. 3, the fifth step is to provide a mold 80, wherein the porous carrier 60, the base 10, the LED chips 30, and the film 70 are received in an interior of the mold 80. The mold 80 includes a bottom die 84 and an upper die 82. The bottom die 84 receives the porous carrier 60, the base, the LED chips 30 and the film 70 therein. The upper die 82 is disposed above the bottom die 84. The upper die 82 defines a penetrating hole 83 in a center thereof.

Figure 4:
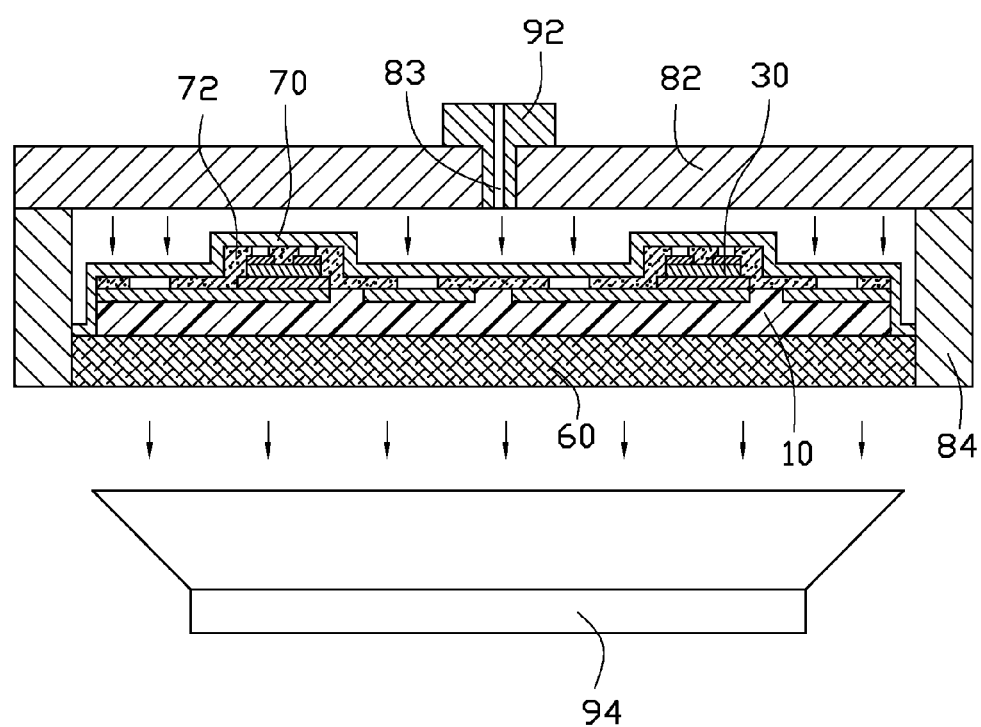

Referring to FIG. 4, the sixth step is to extract air from the interior of the mold 80 through the holes of the porous carrier 60, and/or, blow air toward the film 70 through the penetrating hole 83 of the upper die 82, whereby the film 70 with the phosphor layer 72 is conformably attached onto the base 10 and the LED chips 30. Specifically, a vacuum device 94 is provided. The vacuum device 94 is aligned with a bottom face of the porous carrier 60 to extract the air in the interior of the mold 80, so that the air flows out of the interior of the mold 80 through the holes of the porous carrier 60. A pressurizing device 92 is provided to connect on the penetrating hole 83 of the upper die 82. The pressurizing device 92 blows air towards the film 70 and the phosphor layer 72 through the penetrating hole 83 of the upper die 82 to urge the film 70 and the phosphor layer 72 to move toward the base 10 and the LED chips 30. In practice, an intimate attachment of the film 70 and the phosphor layer 72 onto the base 10 and the LED chips 30 can be achieved by using only one of the vacuum device 94 and the pressurizing device 92, or by using both the vacuum device 94 and the pressurizing device 92 simultaneously.

Figure 5:
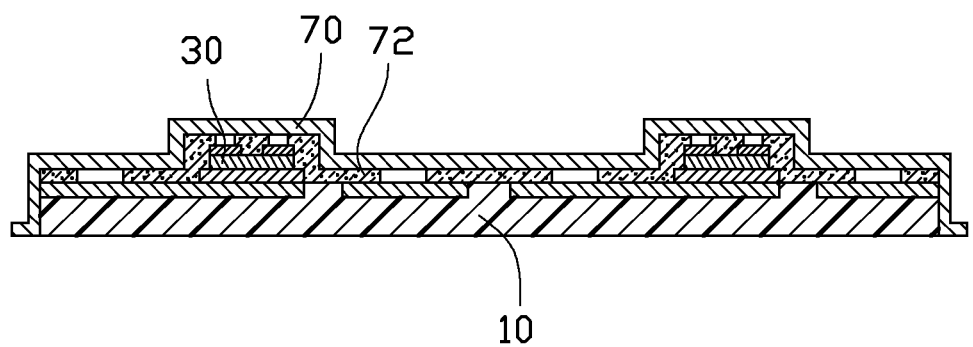

Referring to FIG. 5, the seventh step is to solidify the phosphor layer 72 on the LED chips 30. Specifically, the vacuum device 94, the pressurizing device 92, the mold 80 and the porous carrier 60 are removed firstly, and then the phosphor layer 72 is solidified on the LED chips 30 by means of heating. Alternatively, the vacuum device 94, the pressurizing device 92, the mold 80 and the porous carrier 60 can be removed after the phosphor layer 72 is solidified on the LED chips 30 by means of heating.

Figure 6:
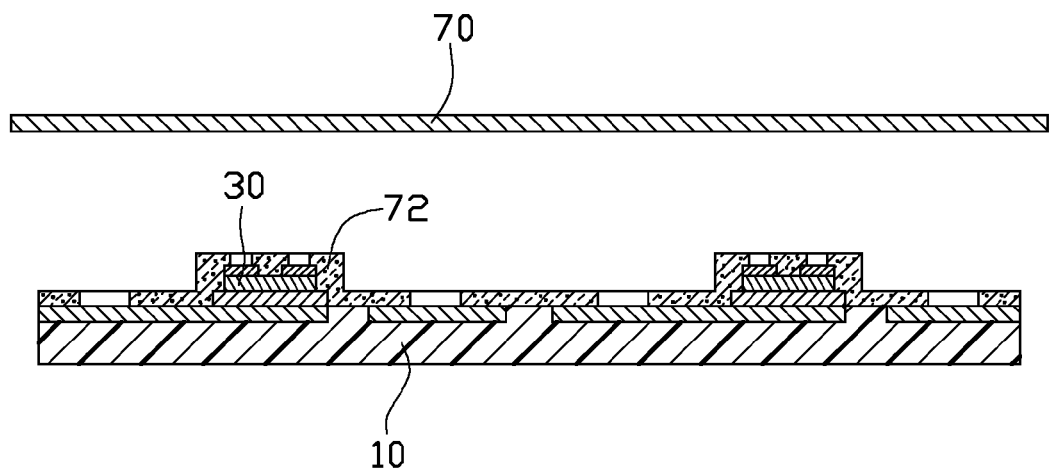
Figure 7:
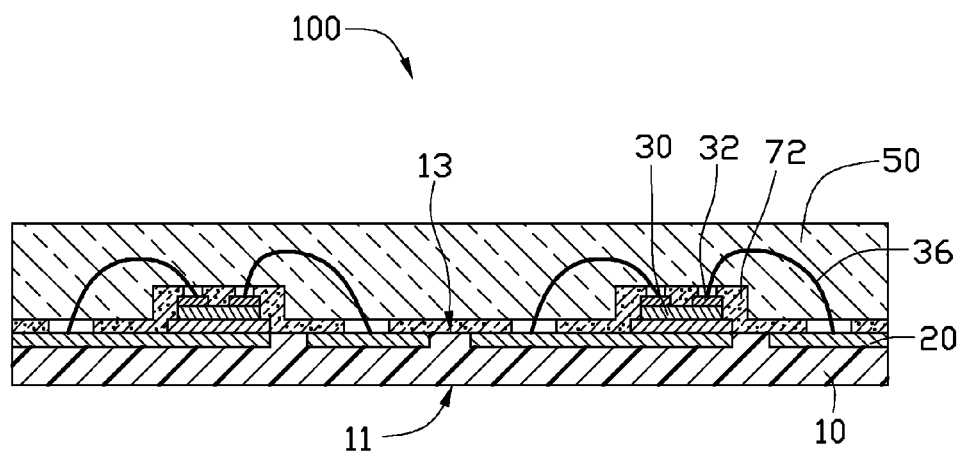

Referring to FIGS. 6-7, the eighth step is to remove the film 70 to expose the phosphor layer 72. The conductive wires 36 extend through the through holes of the phosphor layer 72 to electrically connect the electrodes 32 of the LED chips 30 with the electrical connection portion 20 on the base 10. Transparent encapsulation material is dispensed on the top face of the phosphor layer 72, so that a transparent encapsulation layer 50 encapsulating the LED chips 30 and the phosphor layer 72 is formed. Finally, the LEDs 100 connected together are cut off to obtain a plurality of individual LEDs 100.

According to the disclosure of the method for manufacturing the LED 100, the film 70 with the phosphor layer 72 is initially attached onto the base 10 and the LED chips 30 by extracting air from the interior of the mold 80 through the holes of the porous carrier 60 and/or blowing air toward the film 70 with the phosphor layer 72, and then the phosphor layer 72 is conformably solidified on the LED chips 30. The phosphor layer 72 attached onto the LED chips 30 is in semi-solidified state before solidified on the LED chips 30, which ensures that the fluorescent powders deposition in the phosphor layer 72 will not occur easily, and the fluorescent powders are uniformly distributed in the phosphor layer 72.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED, comprising following steps:
    providing a base and an LED chip, and disposing the LED chip on the base;
    providing a porous carrier with a plurality of holes and disposing the base on the porous carrier;
    providing a film with a phosphor layer attached on the film, and placing the film on the LED chip wherein the phosphor layer contacts the LED chip;
    providing a mold, wherein the porous carrier, the base, the LED chip, and the film are received in an interior of the mold;
    extracting air from the interior of the mold through the holes of the porous carrier, to attach the film with the phosphor layer conformably onto the base and the LED chip; and
    solidifying the phosphor layer.

2. The method of claim 1, wherein a vacuum device is provided, the vacuum device being aligned with a bottom face of the porous carrier to extract the air in the interior of the mold, the air being extracted out of the interior of the mold through the holes of the porous carrier.

3. The method of claim 2, wherein a pressurizing device is further provided, the mold defining a penetrating hole to communicate with the interior thereof, the pressurizing device being connected to the penetrating hole of the mold, the pressurizing device blowing air towards the film through the penetrating hole of the mold to help the conformable attachment of the film with the phosphor layer onto the base and the LED chip.

4. The method of claim 3, wherein the mold comprises a bottom die and an upper die, the bottom die receives the porous carrier, the base, the LED chip, and the film therein, the upper die being disposed above the bottom die, the penetrating hole being defined in the upper die.

5. The method of claim 3, wherein after the film with the phosphor layer is conformably attached onto the base and the LED chip, the vacuum device, the pressurizing device, the mold and the porous carrier are removed, and then the phosphor layer is solidified on the LED chip by means of heating.

6. The method of claim 3, wherein after the film with the phosphor layer is conformably attached onto the base and the LED chip, the phosphor layer is solidified on the LED chip by means of heating, and then the vacuum device, the pressurizing device, the mold and the porous carrier are removed.

7. The method of claim 1, wherein a pressurizing device is further provided, the mold defining a penetrating hole to communicate with the interior thereof, the pressurizing device being connected to the penetrating hole of the mold, the pressurizing device blowing air towards the film through the penetrating hole of the mold to help the conformable attachment of the film with the phosphor layer onto the base and the LED chip.

8. The method of claim 7, wherein the mold comprises a bottom die and an upper die, the bottom die receives the porous carrier, the base, the LED chip, and the film therein, the upper die being disposed above the bottom die, the penetrating hole being defined in the upper die.

9. The method of claim 7, wherein after the film with the phosphor layer is conformably attached onto the base and the LED chip, the vacuum device, the pressurizing device, the mold and the porous carrier are removed, and then the phosphor layer is solidified on the LED chip by means of heating.

10. The method of claim 7, wherein after the film with the phosphor layer is conformably attached onto the base and the LED chip, the phosphor layer is solidified on the LED chip by means of heating, and then the vacuum device, the pressurizing device, the mold and the porous carrier are removed.

11. The method of claim 1, wherein the phosphor layer contains fluorescent powders, the phosphor layer attached onto the LED chip being in a semi-solidified state before solidified on the LED chip.

12. The method of claim 1, wherein the film is removed to expose the phosphor layer after the phosphor layer is solidified on the LED chip.

13. The method of claim 12, wherein an electrical connection portion is arranged on the base, the LED chip comprising two electrodes, the phosphor layer defining a plurality of through holes, conductive wires being extended through the through holes of the phosphor layer to electrically connect the electrodes of the LED chip to the electrical connection portion.

14. The method of claim 12, wherein a transparent encapsulation material is dispensed on the phosphor layer after the film is removed, whereby a transparent encapsulation layer encapsulating the LED chip and the phosphor layer is formed.

* * * * *